(12) United States Patent
Cacho Alonso

(10) Patent No.: US 10,375,860 B2
(45) Date of Patent: Aug. 6, 2019

(54) HEAT EXCHANGER FOR COOLING A SWITCH CABINET AND CORRESPONDING COOLING ARRANGEMENT

(71) Applicant: RITTAL GMBH & CO. KG, Herborn (DE)

(72) Inventor: Juan Carlos Cacho Alonso, Herborn (DE)

(73) Assignee: Rittal GmbH & Co. KG, Herbom (DE)

( * ) Notice: Subject to any disclaimer, the term of this patent is extended or adjusted under 35 U.S.C. 154(b) by 577 days.

(21) Appl. No.: 14/392,021

(22) PCT Filed: Aug. 23, 2013

(86) PCT No.: PCT/DE2013/100306
§ 371 (c)(1),
(2) Date: Feb. 19, 2015

(87) PCT Pub. No.: WO2014/032654
PCT Pub. Date: Mar. 6, 2014

(65) Prior Publication Data
US 2015/0163956 A1 Jun. 11, 2015

(30) Foreign Application Priority Data

Aug. 31, 2012 (DE) ........................ 10 2012 108 109

(51) Int. Cl.
*F28D 15/00* (2006.01)
*H05K 7/20* (2006.01)
(Continued)

(52) U.S. Cl.
CPC .......... *H05K 7/206* (2013.01); *F28D 1/0443* (2013.01); *F28D 1/0477* (2013.01); *F28F 1/32* (2013.01); *H05K 7/207* (2013.01); *H05K 7/20572* (2013.01); *H05K 7/20609* (2013.01); *H05K 7/20645* (2013.01); *H05K 7/20781* (2013.01); *H05K 7/20827* (2013.01)

(58) Field of Classification Search
CPC .... H05K 7/206; H05K 7/20609; H05K 7/207; H05K 7/20827; H05K 7/202572; H05K 7/20781; F28F 1/32; F28D 1/0443; F28D 1/0477
USPC ..................................................... 165/104.14
See application file for complete search history.

(56) References Cited

U.S. PATENT DOCUMENTS 4,738,309 A * 4/1988 Schilling ................... F28D 7/08
  165/101
6,039,111 A * 3/2000 Kawaguchi ......... F28D 15/0266
  165/104.14
(Continued)

FOREIGN PATENT DOCUMENTS

DE      20008411 U1    7/2000
DE  102007054724 A1    5/2009
(Continued)

*Primary Examiner* — Claire E Rojohn, III
(74) *Attorney, Agent, or Firm* — Marshall & Melhorn, LLC

(57) ABSTRACT

The invention relates to a heat exchanger for cooling a switch cabinet, with a first line system for a first coolant and with a second line system, separated fluidically from the first line system, for a second coolant, in which the first and the second line system are coupled thermally to one another, and to a corresponding switch cabinet.

20 Claims, 8 Drawing Sheets

(51) Int. Cl.
*F28D 1/04* (2006.01)
*F28D 1/047* (2006.01)
*F28F 1/32* (2006.01)

(56) References Cited

U.S. PATENT DOCUMENTS

| | | | |
|---|---|---|---|
| 6,053,238 A * | 4/2000 | Goth | F28D 1/0477 165/10 |
| 6,065,531 A * | 5/2000 | Schneider | F24F 13/222 165/122 |
| 6,119,767 A * | 9/2000 | Kadota | F28D 15/0233 165/104.33 |
| 6,167,621 B1 | 1/2001 | Goth et al. | |
| 6,761,212 B2 | 7/2004 | DiPaolo | |
| 2002/0014324 A1 | 2/2002 | DiPaolo | |
| 2004/0118151 A1* | 6/2004 | Hebert | F25B 39/02 62/524 |
| 2008/0156003 A1* | 7/2008 | Mongia | F25B 25/00 62/79 |
| 2010/0212339 A1* | 8/2010 | Kelty | B60L 3/0046 62/129 |
| 2013/0037253 A1* | 2/2013 | Schneider | H05K 7/207 165/267 |
| 2014/0109603 A1* | 4/2014 | Fernandes | B64D 13/06 62/89 |
| 2014/0260389 A1* | 9/2014 | Sistla | F25B 39/028 62/222 |
| 2014/0262188 A1* | 9/2014 | Sistla | F28F 17/005 165/182 |
| 2015/0153070 A1* | 6/2015 | Krupo | F24H 3/00 126/112 |

FOREIGN PATENT DOCUMENTS

| | | |
|---|---|---|
| DE | 102008059023 A1 | 6/2010 |
| DE | 102010009776 A1 | 9/2011 |

* cited by examiner

HEAT EXCHANGER FOR COOLING A SWITCH CABINET AND CORRESPONDING COOLING ARRANGEMENT

BACKGROUND OF THE INVENTION

The invention relates to a heat exchanger for cooling a switch cabinet and to a corresponding cooling arrangement. A generic heat exchanger has a first line system for a first coolant and a second line system, separated fluidically from the first line system, for a second coolant, the first and the second line system being coupled thermally to one another for heat exchange.

A printing machine assembly cabinet which has a heat exchanger with the above-mentioned features is known from DE 200 08 411 U1. Similar heat exchangers are also described in DE 10 2007 054 724 A1, in DE 10 2008 059 023 A1, in U.S. Pat. No. 6,053,238 A and in U.S. Pat. No. 6,039,111 A.

A persistent problem in switch cabinet cooling is that the ambient temperatures of the switch cabinet over the course of the year and also the power losses and accompanying waste heat of the components accommodated in the switch cabinet may be exposed to pronounced fluctuations, while, independently of these fluctuations, the air temperature prevailing in the switch cabinet interior has to be kept below a specific value, in order to avoid the situation where the components accommodated in the switch cabinet are damaged. The cooling apparatuses used for switch cabinet cooling, whether they be passive or active apparatuses, always have, however, a narrow cooling capacity range within which they can operate in an energy-efficient way. For example, compressor-driven cooling apparatuses work in the most energy-efficient way in continuous operation. However, the maximum cooling capacity of the compressor-driven cooling circuit which can be achieved in continuous operation has to be adapted to maximum ambient temperatures and maximum power losses of the components accommodated in the switch cabinet, so that sufficient cooling can be ensured even in extreme situations. As a result of this, the compressor-driven cooling circuit always runs in on/off operation over the course of the year, with the corresponding disadvantages with regard to energy consumption. In principle, to increase the energy efficiency of the cooling apparatus, it is desirable to keep the time duration in which the compressor-driven cooling circuit is in operation as short as possible.

In order to address this problem, combined cooling apparatuses are known from the prior art, which have in addition to an active cooling circuit, such as a compressor-driven cooling circuit or a cold water set, a passive cooling circuit or a passive cooling element, for example in the form of an air/air heat exchanger. Such cooling apparatuses are also designated later on in the application as "hybrid cooling apparatuses". Active cooling circuits have a refrigerating machine or a cold water set, introduce the cold into the system and serve, as a rule, for cooling a cooling medium. The refrigerating machine may have, for example, a compressor. The cold water set may in the simplest case have a cold water reservoir, and in this context a person skilled in the art would understand that "water" in cooling applications is not to be interpreted restrictively, but is used merely as a synonym for the coolants or refrigerants known from the prior art, generally designated as "cooling Medium". Passive cooling circuits accordingly have no refrigerating machine or cold water source. Active cooling of a cooling medium does not take place.

These cooling apparatuses are designed in such a way that the necessary cooling of the switch cabinet interior can be provided solely in a passive way via the air/air heat exchanger over as broad an ambient temperature range of the switch cabinet as possible and for the highest possible power losses of the components accommodated in the switch cabinet, so that the active cooling circuit, that is to say, for example, the compressor-driven cooling circuit, has to be put into operation as backup only when the cooling capacity achievable with the aid of the air/air heat exchanger is not sufficient.

Due to the fact that the structural set-up of a cooling apparatus based on an air/air heat exchanger differs fundamentally from that of a cooling apparatus based on a compressor-driven cooling circuit, in the cooling apparatuses known from the prior art it has not been possible hitherto, or has been possible only at high outlay, for the cooling circuit based on the air/air heat exchanger to be operated in parallel with the compressor-driven cooling circuit. Furthermore, in the known cooling apparatuses, to change over between the cooling processes mentioned, it is always necessary for structural changes to have to be carried out inside the cooling apparatus. For example, air routing has to be adapted to the desired cooling process by altering the pivoting of flaps and the like. This requires corresponding actuating mechanisms and the use of servomotors which reduce the reliability of the system and increase its complexity. This is critical especially in light of the fact that the failure of the cooling apparatus may cause the system composed of electronic components and accommodated in the switch cabinet interior to fail or even to be destroyed.

SUMMARY OF THE INVENTION

The object of the invention, therefore, is to provide a heat exchanger for cooling a switch cabinet and a corresponding switch cabinet, which ensure the energy-efficient and reliable cooling of the switch cabinet, while, furthermore, these should allow the especially flexible adaptation of the cooling apparatus to the individual conditions, such as the power loss of the switch cabinet components and the ambient temperature of the switch cabinet.

This object is achieved, according to the invention, by means of a heat exchanger with a first line system for a first coolant and with at least one second line system, separated fluidically from the first line system, for a second coolant. The first and the second line system being coupled thermally to one another. The heat exchanger comprises a plurality of lamellae, adjacent lamellae forming between them an air flow duct through the heat exchanger, and the first and the second line system being coupled thermally to one another via the plurality of lamellae.

According to the invention, the heat exchanger has a plurality of lamellae oriented preferably parallel to one another, adjacent lamellae forming between them an air flow duct through the heat exchanger, and the first and the second line system being coupled thermally to one another via the plurality of lamellae for heat exchange. The lamellae serve for coupling thermally to one another the line systems of the heat exchanger which are basically formed independently of one another, in particular are separated fluidically from one another, so that there is heat exchange between the first and the second line system whenever the temperature difference between the coolants held in reserve in the two line systems is unequal to zero.

The heat exchanger according to the invention is therefore, in principle, an air-cooled lamellar heat exchanger which allows heat exchange between the air flowing through it and a coolant of the first line system and/or a further coolant of the second line system. One of the line systems may in this case be, for example, an integral part of an active cooling process, for example an integral part of a compressor-driven cooling circuit, while the other line system is incorporated, for example, into a passive cooling circuit. The heat exchanger according to the invention is also distinguished precisely in that it affords high variability in terms of the implemented cooling process when it is used for setting up a cooling apparatus for switch cabinet cooling. In principle, however, the heat exchanger according to the invention is not restricted to switch cabinet cooling applications, but on the contrary it may be used in the most diverse possible industrial cooling applications or else for domestic purposes.

Preferably, the first and the second line system are disposed one behind the other in the air flow direction through the heat exchanger. If one of the two line systems is an integral part of a passive cooling system and the other line system is an integral part of an active cooling system, it is expedient that the line system of the passive cooling circuit is disposed upstream of the line system of the active cooling circuit in the air flow direction.

The heat exchanger according to the invention should be a modular component which can serve in one and the same embodiment for the configuration of the most diverse possible cooling apparatuses for switch cabinet air conditioning. In order to allow the flexible integration of said heat exchanger into a switch cabinet cooling apparatus, in one embodiment of the invention there is provision whereby the first and the second line system have in each case a connection for a coolant forward flow and a connection for a coolant return flow. The switch cabinet according to the invention comprises a cooling apparatus which has a first and a second heat exchanger of the abovementioned type, the first heat exchanger being disposed in a first air passage with a first air inlet and with a first air outlet, which are open to the surroundings of the switch cabinet, and the second heat exchanger being disposed in a second air passage with a second air inlet and with a second air outlet, which are open to an interior of the switch cabinet, the first line system of the first heat exchanger forming with the first line system of the second heat exchanger a first closed coolant circuit, and the second line system of the first heat exchanger forming with the second line system of the second heat exchanger a second closed coolant circuit.

In one embodiment of the invention, the cooling apparatus is a wall-mounted cooling apparatus fastened to a vertical wall of the switch cabinet. In this case, preferably, the first heat exchanger is disposed at least partially above the second heat exchanger, at least one of the two coolant circuits being a passive circuit. If the heat exchangers are disposed as described above, and one of the two coolant circuits is a closed passive circuit, in the case of switch cabinet temperatures lying above the ambient temperature of the switch cabinet, when the passive coolant circuit is filled at least partially with a coolant, the coolant held in reserve in the passive coolant circuit in the region of the second heat exchanger will change from the liquid to the gaseous state of aggregation on account of the heat of the switch cabinet air, will rise into the first heat exchanger, will be cooled there by the cooler ambient air and will therefore condense, in order thereupon, driven by gravity, to flow back again into the second heat exchanger.

While the coolant is absorbing heat in the second heat exchanger upon evaporation, it discharges this same heat quantity again upon condensation in the first heat exchanger. The coolant extracts this heat quantity in the second heat exchanger precisely from the switch cabinet air flowing through the second heat exchanger and, upon condensation in the first heat exchanger, discharges it into the ambient air. A net heat flux from the second air passage into the first air passage therefore takes place.

In the preferred embodiment, one of the two coolant circuits is a passive circuit and the other is an active circuit, preferably a compressor- or pump-driven circuit, the first heat exchanger being disposed in the first air passage and the second heat exchanger in the second air passage in such a way that the line system of the passive coolant circuit is disposed upstream of the line system of the active coolant circuit in the air flow direction. The active coolant circuit may in this case be configured in many different ways. It may, for example, be a compressor circuit, with a compressor, with a condenser, with an expansion valve and with an evaporator, the condenser and the evaporator being provided precisely by the first and the second heat exchanger. It may, however, also be a cold water circuit, in which heat transport takes place via the circulation of a liquid coolant, preferably water. The liquid coolant flowing through the second heat exchanger in the second air passage may in this case be provided with the aid of an external cold water source or via the first heat exchanger disposed in the first air passage.

An alternative switch cabinet according to the invention has a first and a second heat exchanger according to the invention, once again the first heat exchanger being disposed in a first air passage with a first air inlet and with a first air outlet, which are open to the surroundings of the switch cabinet, and the second heat exchanger being disposed in a second air passage with a second air inlet and with a second air outlet, which are open to an interior of the switch cabinet, in which case either:

1. the first and the second line system of the first heat exchanger are connected in series, the series-connected line systems forming either with the first or with the second line system of the second heat exchanger a closed coolant circuit, and a coolant flowing through that line system of the second heat exchanger which is not an integral part of the closed coolant circuit; or
2. the first and the second line system of the second heat exchanger are connected in series, the series-connected line systems forming either with the first or with the second line system of the first heat exchanger a closed coolant circuit, and a coolant flowing through that line system of the first heat exchanger which is not an integral part of the closed coolant circuit.

In this case, there may be provision whereby the first heat exchanger is disposed at least partially above the second heat exchanger, the closed coolant circuit being a passive circuit, and the line system through which the coolant flows being an integral part of an active, preferably pump- or compressor-driven cooling circuit.

In a further embodiment of the invention, the heat exchanger which has the line system through which the coolant flows is an evaporator or an air/water heat exchanger of the active cooling circuit and at the same time, when the line system through which the coolant flows is an integral part of the first heat exchanger, a condenser of the passive cooling circuit or, when the line system through which the coolant flows is an integral part of the second heat exchanger, an evaporator of the passive cooling circuit.

In one embodiment of the invention, one of the coolant circuits is a passive circuit and the other is a compressor-driven coolant circuit, a compressor and an expansion means of the active coolant circuit being in each case either bridged via a selectively openable and closable bypass line or being capable of assuming a state in which a coolant screen can be passed through essentially without pressure loss. In this embodiment, the hybrid cooling apparatus has four different operating modes. In a first operating mode, the first coolant circuit is operated actively and the second coolant circuit is deactivated. In a second operating mode, the first coolant circuit is operated passively and the second coolant circuit is deactivated. In a third operating mode, the first coolant circuit is operated actively and the second coolant circuit passively. In a fourth operating mode, both the first and the second coolant circuit are operated passively. The first coolant circuit therefore has to be operated actively only when the sum of the cooling capacities of the first and of the second cooling circuit, when the first coolant circuit is also operated passively in addition to the second, is not sufficient.

Instead of the bypass lines, there may also be provision whereby the expansion means or the compressor can assume a state in which they cause the coolant to pass through essentially without pressure loss. Thus, in the case of expansion means which are designed, for example, as expansion valves with a needle valve, the valve can be brought into an open position in which the coolant can pass, essentially unimpeded, through the expansion valve. It is likewise conceivable that the compressor either has an integrated bypass line or can assume an operating position in which the coolant can pass, unimpeded, through it.

BRIEF DESCRIPTION OF THE DRAWINGS

Further details of the invention are explained with reference to the following Figures in which.

DETAILED DESCRIPTION OF THE INVENTION

Figure 1:
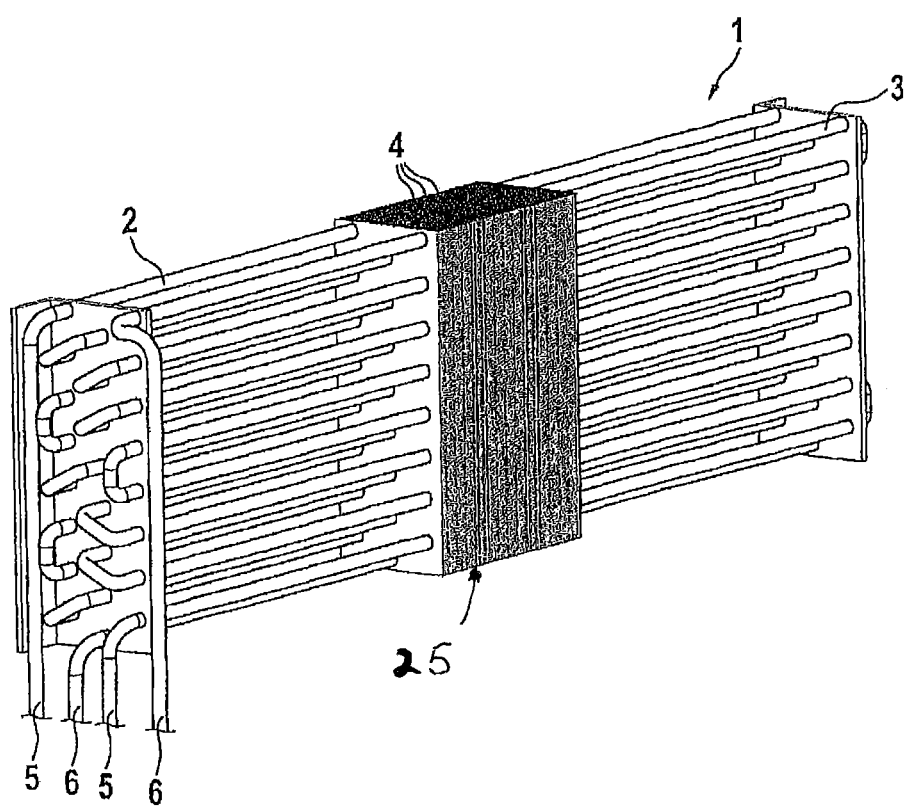
FIG. 1 shows an embodiment of the heat exchanger according to the invention in which, for greater clarity, the lamellae have been partially omitted.

The heat exchanger 1 according to FIG. 1 has a first line system 2, in which a first coolant is routed, and a second line system 3, in which a second coolant is routed. The line systems 2, 3 are composed in each case of parallel pipe tracks which extend between two longitudinal ends of the heat exchanger 1. The parallel pipelines are connected to one another at the longitudinal ends in such a way that the coolant is routed between a respective coolant forward flow 5 and a coolant return flow 6. The heat exchanger 1 illustrated in FIG. 1 is designed to have a gas, for example air, flowing through its longitudinal sides, vertical in the illustration. The heat exchanger 1 has a plurality of lamellae 4, adjacent lamellae forming between them in each case an air flow duct 25 through the heat exchanger. Furthermore, the lamellae 4, which may also be designed as plates corresponding to a plate heat exchanger, have the task of coupling the first and the second line system 2, 3 thermally to one another for heat exchange. In the above-described flow direction of the air flowing through the heat exchanger 1, the first and the second line system 2, 3 are disposed one behind the other in the air flow direction. If the first line system 2 is an integral part of a passive cooling circuit and the second line system 3 is an integral part of an active cooling circuit, and if, furthermore, there is provision whereby the cooling of the air flowing through the heat exchanger 1 preferably takes place via the passive cooling process, there may be provision whereby the active cooling process is activated only when the cooling capacity provided by the passive cooling circuit is not sufficient. Since the two cooling circuits are implemented independently of one another, it is not necessary for the passive cooling circuit to be interrupted or even completely deactivated in order to switch on the active cooling circuit. When the active cooling circuit is deactivated and cooling is therefore to take place via the passive cooling circuit, the pipelines of the line system of the active cooling circuit in the first heat exchanger 1 serve for increasing the cooling capacity of the line system of the passive cooling circuit by virtue of the heat coupling implemented with the aid of the lamellae 4. Even when the active cooling circuit is thus deactivated, its line system in the heat exchanger 1 is not useless. Instead, it serves in this case for increasing the efficiency of the passive cooling circuit. When both cooling circuits are activated, heat transport between the first and the second line system 2, 3 likewise takes place according to a temperature gradient which is established, as a result of which heat or cold peaks inside the heat exchanger 1 are avoided, so that, in turn, an increase in the efficiency of the heat exchanger is achieved.

Figure 2:
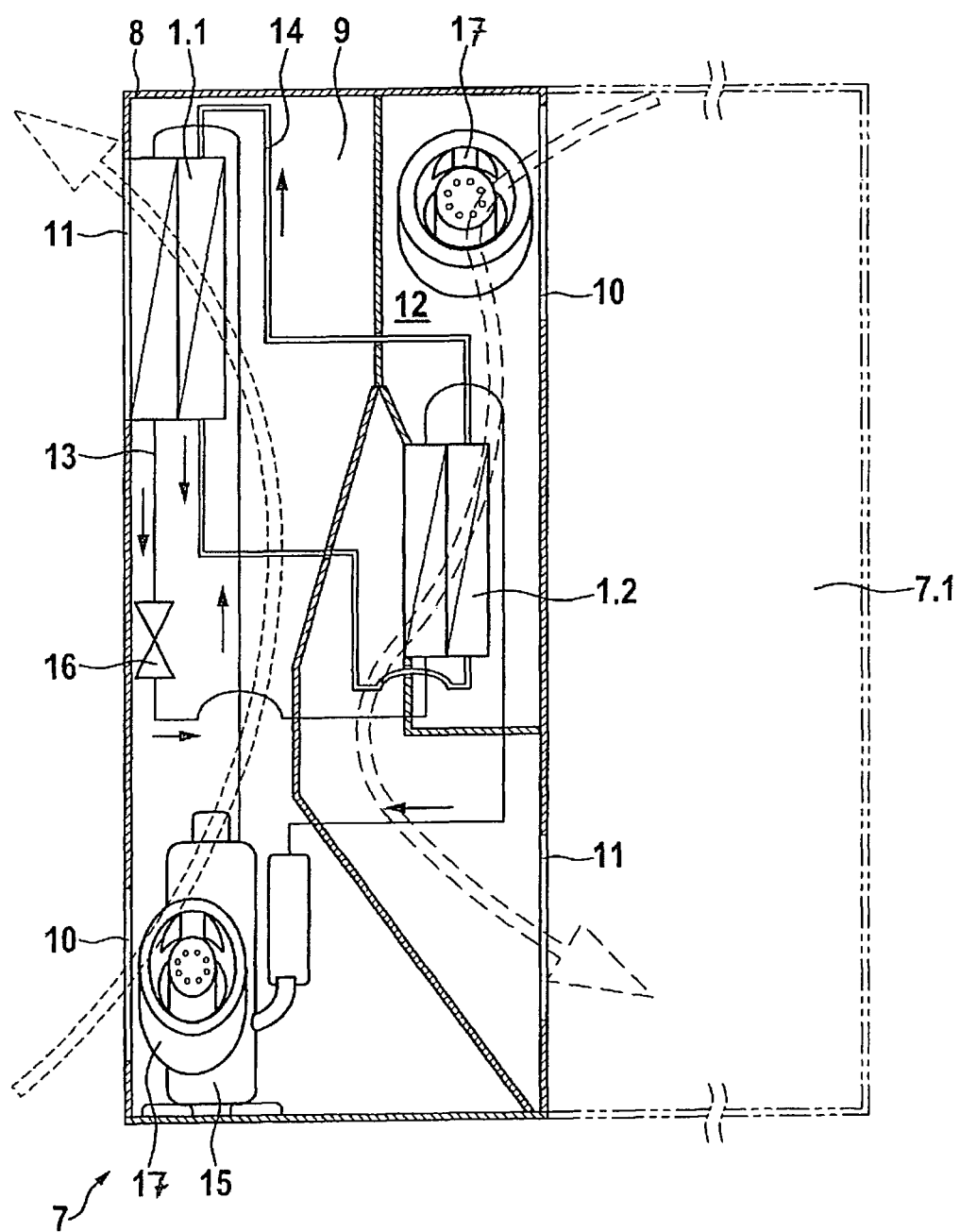
FIG. 2 shows a diagrammatic cross-sectional view of a hybrid cooling apparatus for wall mounting, which combines a heat pipe with a compressor-driven cooling circuit.

FIG. 2 shows a switch cabinet 7 in which the cooling apparatus 8 is designed as a wall-mounted cooling apparatus. The switch cabinet 7 comprises a switch cabinet interior 7.1, the cooling apparatus 8 being attached to an outer wall of the switch cabinet 7, and the interior 7.1 of the switch cabinet 7 being connected fluidically to the second air passage 12 of the cooling apparatus 8 via an air inlet 10 and an air outlet 11. The air received in the switch cabinet 7.1 is transported through the air passage 12 with the aid of the fan 17. A second heat exchanger 1.2 according to the invention, as shown in FIG. 1, is disposed in the second air passage 12. The cooling apparatus 8 has, separated fluidically from the second air passage 12, a first air passage 9 which is connected fluidically to the surroundings of the switch cabinet 7 via an air inlet 10 and an air outlet 11. A fan 17 serves, in turn, for transporting ambient air via the inlet 10 into the first air passage 9 of the cooling apparatus 8. Disposed in the first air passage 9 is a first heat exchanger 1.1 according to the invention, as shown in FIG. 1, through which the air routed through the first air passage 9 flows. The heat exchangers 1.1, 1.2 are connected fluidically to one another in such a way that the first line system 2 of the first heat exchanger 1.1 forms with the first line system 2 of the second heat exchanger 1.2 a first closed coolant circuit 13 and the second line system 3 of the first heat exchanger 1.1 forms with the second line system 3 of the second heat exchanger 1.2 a second closed coolant circuit 14.

In the embodiment according to FIG. 2, the first closed coolant circuit 13 is a compressor-driven coolant circuit with a compressor 15 and with an expansion valve 16. Consequently, the first heat exchanger 1.1, insofar as it relates to the first closed coolant circuit 13, has the function of a condenser, and the second heat exchanger 1.2, insofar as it relates to the first closed coolant circuit 13, has the function of an evaporator.

The second closed coolant circuit 14 forms a passive cooling circuit. For this purpose, the first heat exchanger 1.1 is disposed above the second heat exchanger 1.2. The second closed coolant circuit 14 is filled at least partially with a coolant. The liquid coolant settles as a consequence of gravity in the lower region of the second closed coolant circuit 14. It is precisely there where the second heat exchanger 1.2 is disposed. The warm switch cabinet air transported through the second air passage 12 flows through the second heat exchanger 1.2. In this case, the coolant of the second closed coolant circuit 14 heats up, whereupon it evaporates at least partially. The evaporating coolant rises into the first heat exchanger 1.1. The latter is cooled by the cool ambient air of the switch cabinet 7 which is transported through the first air passage 9 with the aid of the fan 17, whereupon the gaseous coolant in the first heat exchanger 1.1 condenses. The condensed coolant, driven by gravity, travels out of the first heat exchanger 1.1 back into the lower-lying second heat exchanger 1.2 and can evaporate once again there and rise into the second heat exchanger 1.2.

The cooling apparatus 8 according to FIG. 2 can thus be operated selectively in three different cooling modes, to be precise solely active, solely passive or hybrid, wherein in hybrid operation, in particular, there may be provision whereby the passive cooling process is operated permanently, while the active cooling process serves for supplementing the cooling capacity provided with the aid of the passive cooling process, to an extent such that, in sum, at least the required cooling capacity is made available.

FIGS. 3 to 7 illustrate that essentially one and the same cooling apparatus set-up can serve for implementing a multiplicity of different cooling processes. In this case, the embodiments according to FIGS. 3 to 5 relate to wall-mounted cooling apparatuses and the embodiments according to FIGS. 6 and 7 to cooling apparatuses which are designed as roof mountings.

Figure 3:
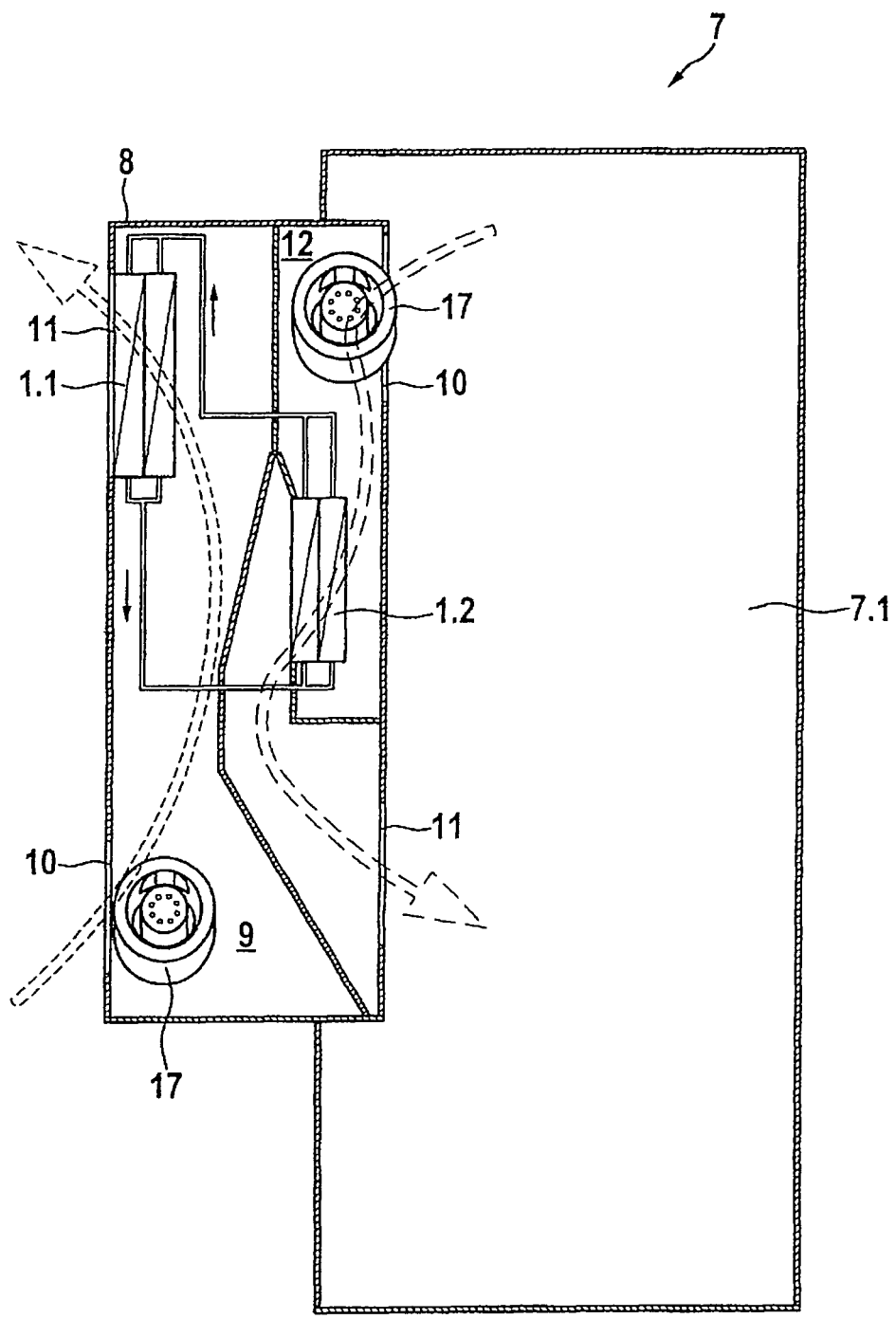
FIG. 3 shows a cooling apparatus according to the invention which has only a heat pipe.

The cooling apparatus 8 according to FIG. 3 has two heat exchangers 1.1, 1.2 according to the invention, in which in each case the first and the second line system 2, 3 are connected in series in such a way that the respective heat exchanger 1.1, 1.2 has in each case a connection for a coolant forward flow and a connection for a coolant return flow. The cooling circuit has no active components, such as compressors, condensers or pumps, and is therefore based on the heat pipe principle already described above. For this purpose, in particular, it is necessary that the first heat exchanger 1.1 is disposed at least partially above the second heat exchanger 1.2.

Figure 4:
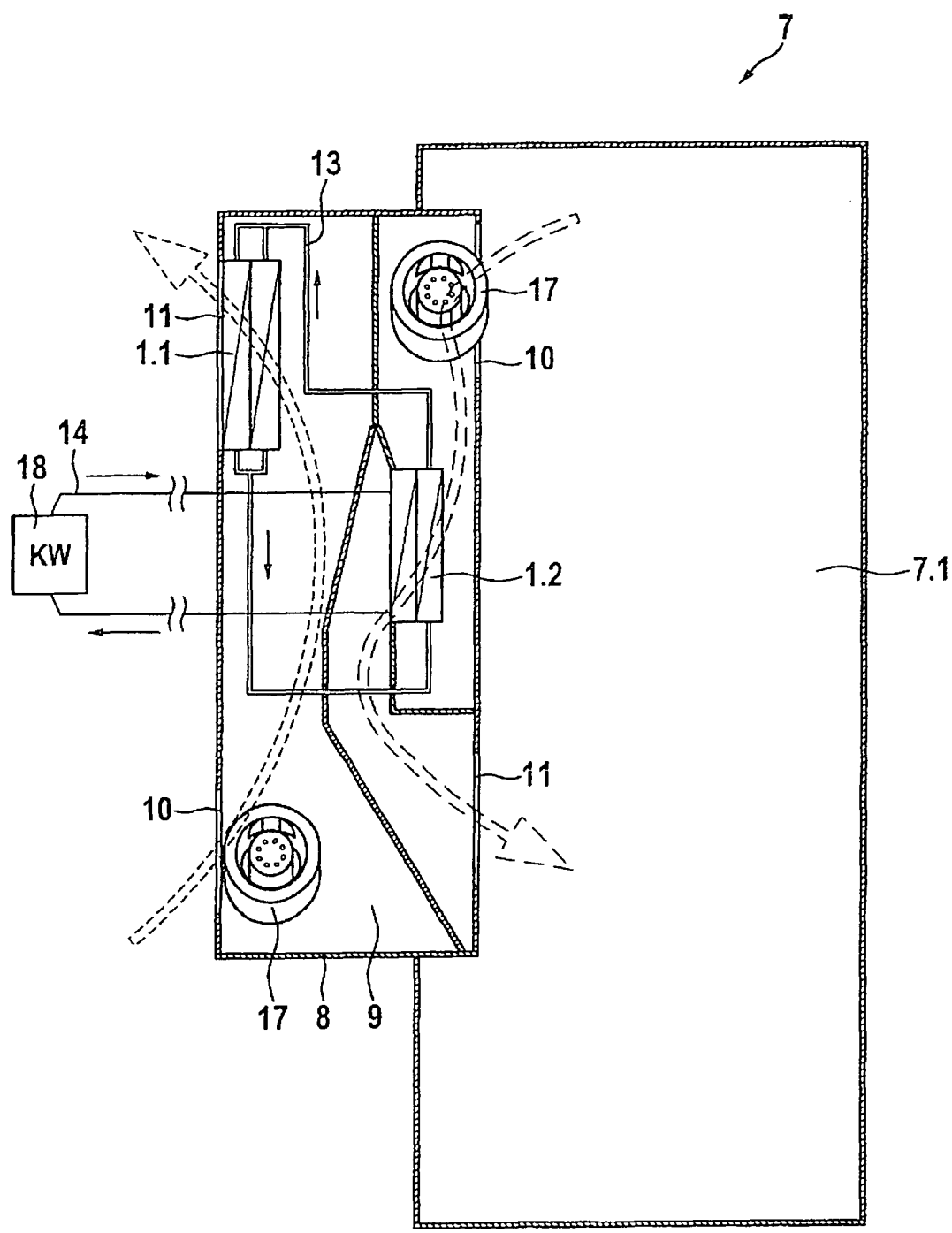
FIG. 4 shows a hybrid cooling apparatus according to the invention which has a cold water set in the inner circuit.

As FIG. 4 shows, essentially the same set-up of the cooling apparatus 8 can be used to implement a hybrid cooling process in which the first and the second line system 2, 3 of the first heat exchanger 1.1 are connected in series, these forming with one of the two line systems 2, 3 of the second heat exchanger 1.2 a passive closed cooling circuit 13. The remaining line system 2,3 of the second heat exchanger 1.2 forms with a cold water source 18 a second closed coolant circuit 14. The cold water source 18 provides cooled water which is circulated through the heat exchanger 1.2 and is not an integral part of the cooling apparatus 8. This additional active coolant circuit 14 may therefore serve, either in the case of high power losses of the components accommodated in the switch cabinet interior 7.1 or in the case of high ambient temperatures of the switch cabinet 7, for making available an additional cooling capacity which supplements the cooling capacity provided with the aid of the passive cooling circuit 13, to an extent such that, in sum, sufficient switch cabinet cooling is made available.

Figure 5:
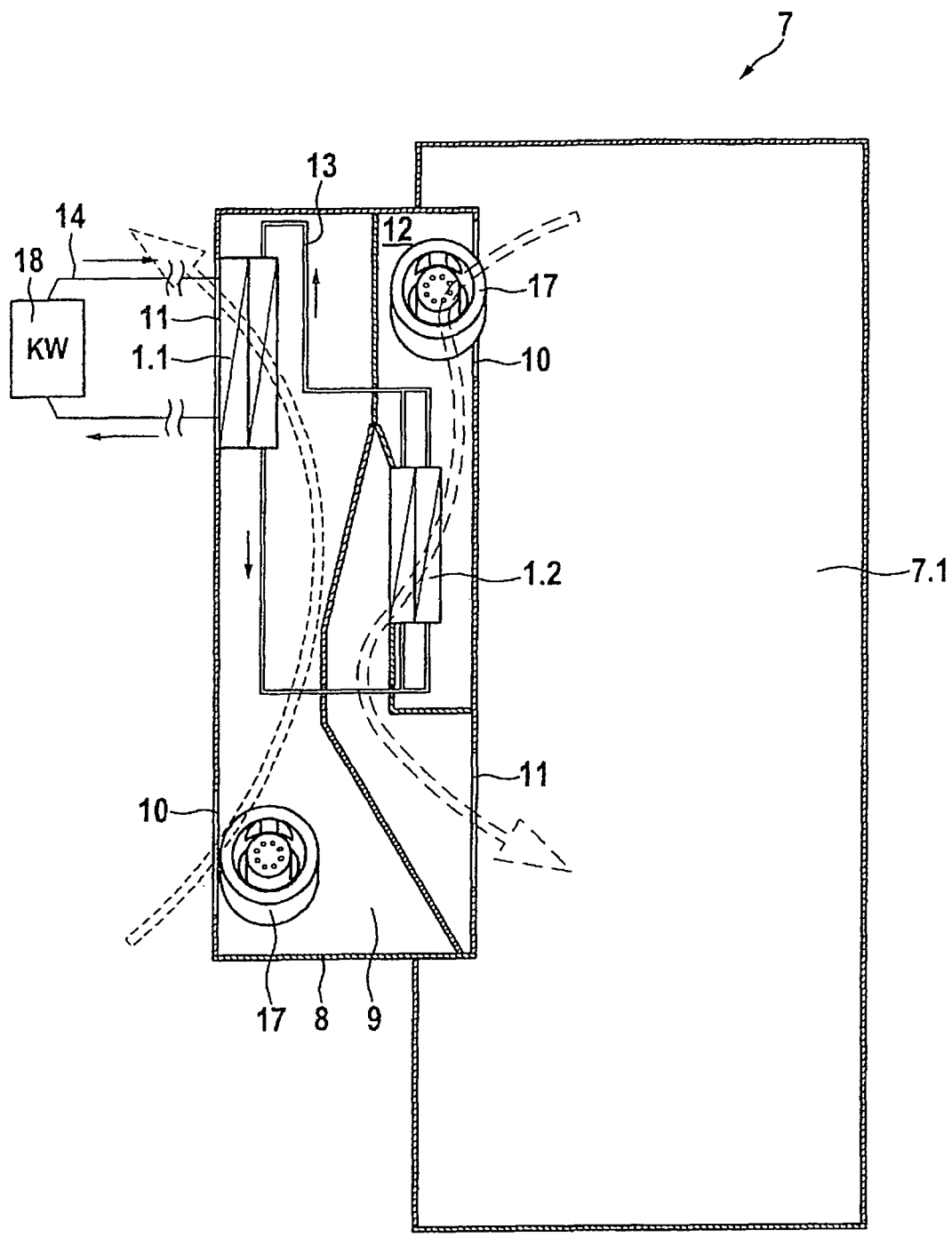
FIG. 5 shows a variant of the embodiment according to FIG. 4, in which a cold water set is disposed in the outer circuit.

Particularly in the case of high ambient temperatures, it may be expedient, corresponding to the set-up according to FIG. 5, to implement the additional active coolant circuit 14 with the aid of the heat exchanger 1.1 integrated into the second air passage 9.

Figure 6:
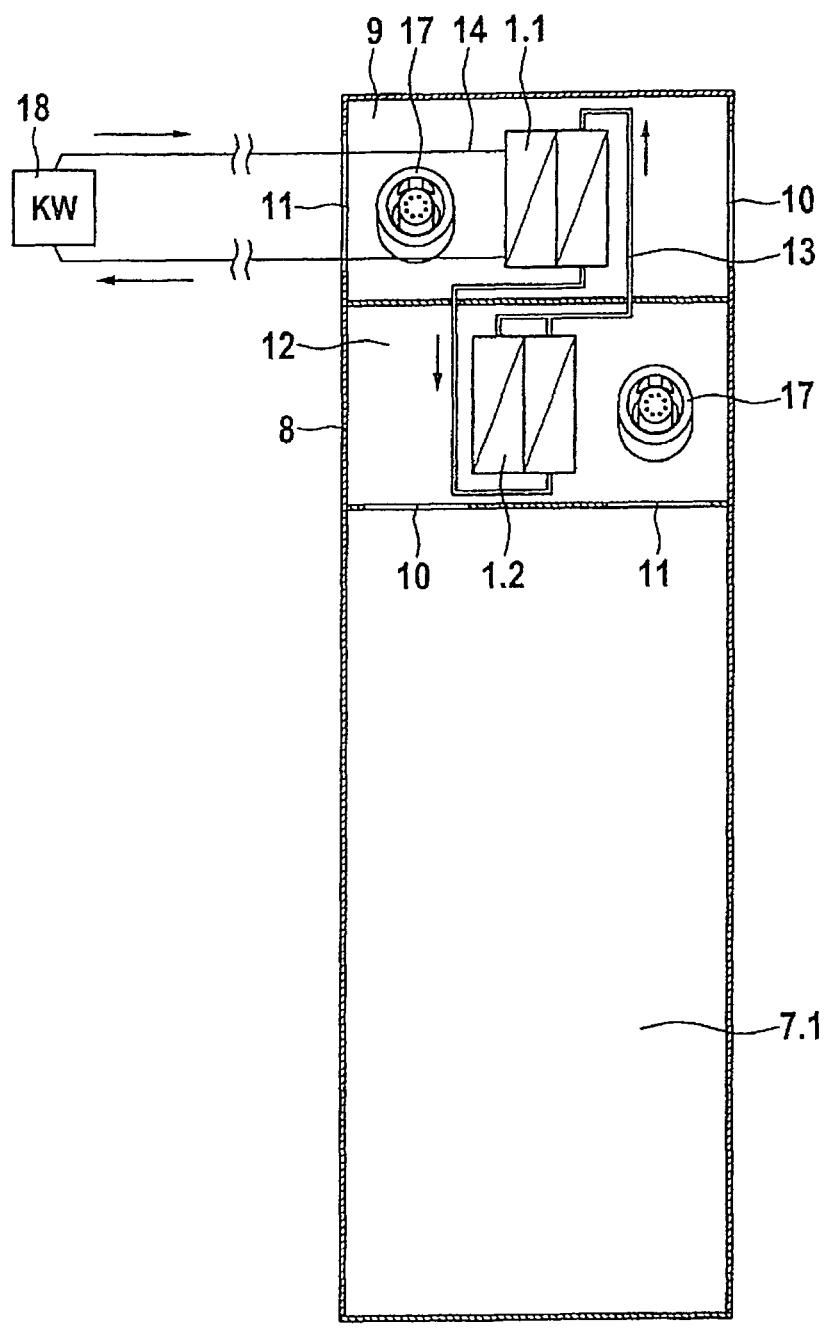
FIG. 6 shows a hybrid cooling apparatus for roof mounting, in which a cold water set is disposed in the outer circuit.
Figure 7:
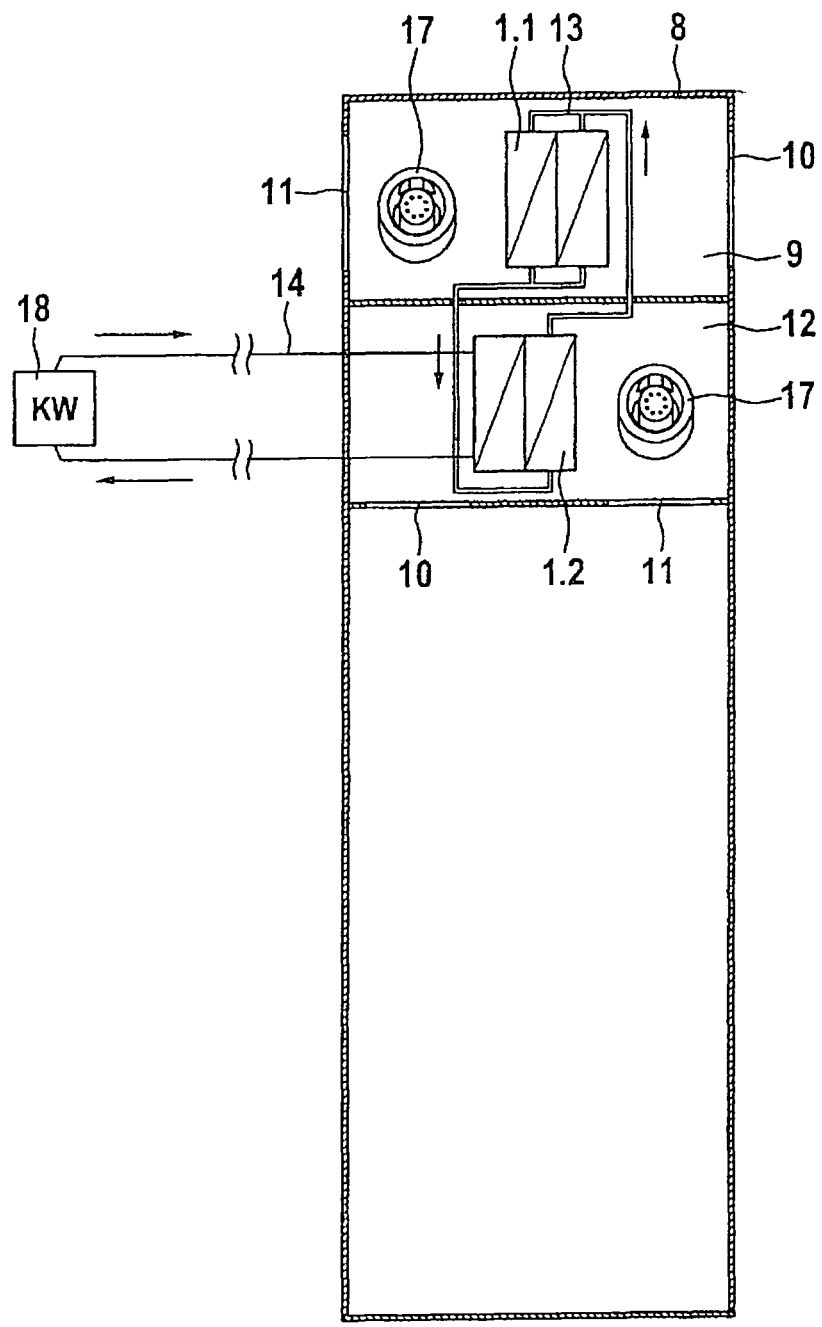
FIG. 7 shows a variant of the cooling apparatus according to FIG. 6, in which a cold water set is disposed in the outer circuit.

FIGS. 6 and 7 show that cooling apparatus 8 for roof mounting, which have the high variability according to the invention, can be implemented in a similar way to FIGS. 3 and 4. Even where cooling apparatuses implemented as roof mountings are concerned, the user is free to implement the active coolant circuit 14, in addition to the passive coolant circuit 13, either in the outer circuit via the first heat exchanger 1.1 (see FIG. 6) or in the inner circuit via the second heat exchanger 1.2 (see FIG. 7).

Figure 8:
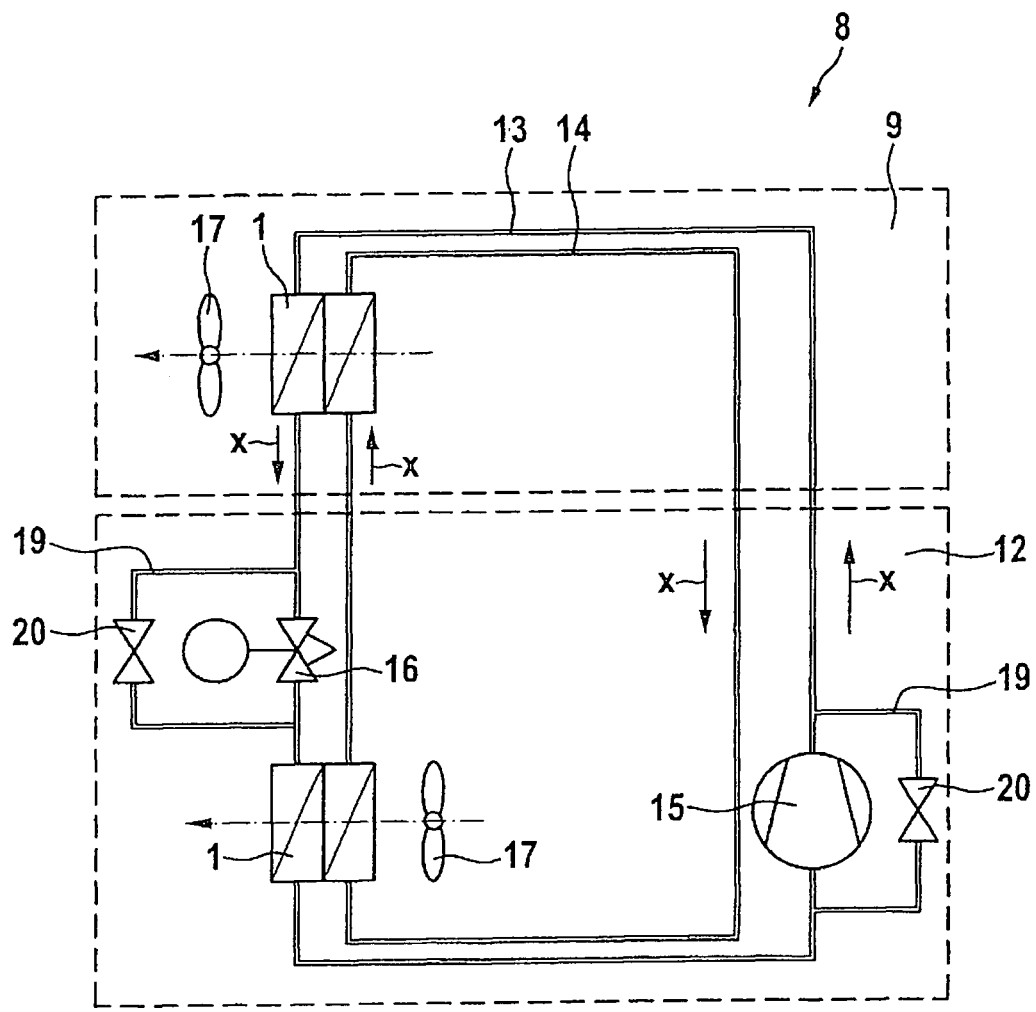
FIG. 8 shows a hybrid cooling apparatus in which the active cooling circuit can be selectively switched to passive via bypasses.

FIG. 8 describes an alternative embodiment of the hybrid cooling apparatus 8 according to the invention, with a first and a second heat exchanger 1 according to the invention which couple a first closed coolant circuit 13 and a second closed coolant circuit 14 thermally to one another. The first closed coolant circuit 13 is an active coolant circuit which has one behind the other in the coolant flow direction a compressor 15, a condenser in the form of the upper heat exchanger 1, an expansion means 16 and an evaporator in the form of the lower heat exchanger 1. The compressor 15 and the expansion means 16 are bridged via a bypass line 19 which has in each case a valve 20. In the closing position of the valves 20, the first closed coolant circuit 13 can be operated actively. When the valves 20 are opened, the heat exchangers 1 form a heat pipe and therefore a passive coolant circuit. The two coolant circuits 13, 14 are disposed in relation to one another in such a way that the respective refrigerants are transported in the opposite direction to one another when the first coolant circuit 13 is operated actively. A second coolant is routed in the second coolant circuit 14 between the evaporator and the condenser.

The condenser and the evaporator are in each case configured in such a way that the two coolant circuits 13, 14 are coupled thermally to one another via the evaporator and the condenser. The condenser is disposed at a vertical distance above the evaporator. The condenser is disposed in a first air passage 9, formed by a first sub-housing of the cooling apparatus, of the cooling apparatus 8 and the evaporator and also the compressor 15 and the expansion means 16 are disposed in a second air passage 12, formed by a second sub-housing of the cooling apparatus. Ambient air of the switch cabinet is transported through the first air passage 9 and, in particular, the condenser with the aid of a fan 17. Heated air from the switch cabinet interior is transported through the second air passage 12 and, in particular, the evaporator with the aid of a further fan 17. The valves 20 in the bypass lines 19 are preferably electrically activatable solenoid valves.

The second coolant in the second coolant circuit 14 is heated via the warm switch cabinet air transported through the second air passage 12, whereupon said second coolant evaporates at least partially or reduces its density at least to an extent such that it is transported along the second coolant circuit 14 from the evaporator into the condenser. Cool ambient air of the switch cabinet flows around the condenser. The coolant thereby condenses or is compressed in such a way that it flows along the coolant circuit 14 back into the evaporator, in order to be heated once again there by the warm switch cabinet air. If the first coolant circuit 13 is likewise in the passive operating mode, even in this, the refrigerant can circulate between the evaporator and the condenser in the way described above with reference to the second coolant circuit 14. In this case, the transport direction of the first coolant in the first coolant circuit 13 is opposite to the depicted flow direction x. The depicted flow direction x of the first coolant in the first coolant circuit 13 corresponds to that which occurs during the active operation of the first coolant circuit 13. In this case, the coolants in the first and the second coolant circuit 13, 14 thus move in opposite directions, with the result that the efficiency of the evaporator and of the condenser is further improved.

The invention claimed is:

1. A heat exchanger for cooling a switch cabinet, with a first line system for a first coolant and with a second line system, separated fluidically from the first line system, for a second coolant, the first and the second line system being coupled thermally to one another, wherein the heat exchanger comprises a plurality of lamellae, adjacent lamellae forming between them an air flow duct through the heat exchanger, the air flow duct comprising an air flow direction through the heat exchanger, and one of the first and the second line systems being disposed behind the other of the first and second line systems in the air flow direction and being coupled thermally to one another via the plurality of lamellae.

2. The heat exchanger as claimed in claim 1, in which the lamellae are oriented parallel to one another.

3. The heat exchanger as claimed in claim 1, wherein there is an air flow direction in the heat exchanger and in which the first and the second line system are disposed directly or indirectly aligned with each other in the air flow direction through the heat exchanger.

4. The heat exchanger as claimed in claim 1, in which the first and the second line system have in each case a connection for a coolant forward flow and a connection for a coolant return flow.

5. The heat exchanger as claimed in claim 1, wherein the heat exchanger has two longitudinal ends, in which at least one of the line systems is routed through parallel pipe tracks which extend between the two longitudinal ends of the heat exchanger so that coolant is routed between a coolant forward flow and a cool end return flow, to prevent formation of siphons.

6. A cooling arrangement with a switch cabinet and with a cooling apparatus which has a first and a second heat exchanger as claimed in claim 1, the first heat exchanger being disposed in a first air passage with a first air inlet and with a first air outlet, which are open to an area surrounding the switch cabinet, and the second heat exchanger being disposed in a second air passage with a second air inlet and with a second air outlet, which are open to an interior of the switch cabinet, the first line system of the first heat exchanger forming with the first line system of the second heat exchanger a first closed coolant circuit, and the second line system of the first heat exchanger forming with the second line system of the second heat exchanger a second closed coolant circuit.

7. The cooling arrangement as claimed in claim 6, in which the first heat exchanger is disposed at least partially above the second heat exchanger, at least one of the two coolant circuits being a passive circuit.

8. The cooling arrangement as claimed in claim 6, wherein there is an air flow direction in each of the first and second heat exchangers and in which one of the two coolant circuits is a passive coolant circuit and the other an active coolant circuit, the first heat exchanger being disposed in the first air passage and the second heat exchanger being disposed in the second air passage, in such a way that the line system of the passive coolant circuit is disposed upstream of the line system of the active coolant circuit in the air flow direction of the heat exchangers.

9. A cooling arrangement with a switch cabinet and with a cooling apparatus which has a first and a second heat exchanger as claimed in claim 1, the first heat exchanger being disposed in a first air passage with a first air inlet and with a first air outlet, which are open to an area surrounding the switch cabinet, and the second heat exchanger being disposed in a second air passage with a second air inlet and with a second air outlet, which are open to an interior of the switch cabinet, in which either:
  1) the first and the second line system of the first heat exchanger are connected in series, the series-connected line systems forming either with the first or with the second line system of the second heat exchanger a closed coolant circuit, and a coolant flowing through the other of the first or second line system of the second heat exchanger; or
  2) the first and the second line system of the second heat exchanger are connected in series, the series-connected line systems forming either with the first or with the second line system of the first heat exchanger a closed coolant circuit, and a coolant flowing through the other of the first or second line system of the first heat exchanger.

10. The cooling arrangement as claimed in claim 9, in which the first heat exchanger is disposed at least partially above the second heat exchanger, the closed coolant circuit being a passive coolant circuit and the line system through which the coolant flows being an integral part of an active, preferably pump- or compressor-driven cooling circuit.

11. The cooling arrangement as claimed in claim 10, wherein the active cooling circuit is pump or compression driven.

12. The cooling arrangement as claimed in claim 10, in which the heat exchanger which has the line system through which the coolant flows is an evaporator or an air/water heat exchanger of the active cooling circuit and contemporaneously, when the line system through which the coolant flows is an integral part of the first heat exchanger, is a condenser of the passive cooling circuit or, when the line system through which the coolant flows is an integral part of the second heat exchanger, is an evaporator of the passive cooling circuit.

13. The cooling arrangement as claimed in claim 6, in which one of the two coolant circuits is a passive coolant circuit and the other is a compressor-driven coolant circuit, a compressor, a control means and an expansion means of the active coolant circuit either being bridged via a selectively openable and closable bypass line or being capable of assuming a state in which a coolant can pass through them with insignificant pressure loss.

14. The heat exchanger of claim 1, wherein the first line system is an integral part of a passive cooling circuit, and the second line system is an integral part of an active cooling circuit, wherein in the air flow direction the first line system is disposed upstream of the second line system.

15. The heat exchanger of claim 14, wherein the first line system is an integral part of a heatpipe cooling circuit, and the second line system is an integral part of a compressor driven cooling circuit or of a cold water set.

16. A cooling arrangement including a switch cabinet and a cooling apparatus which has a first and a second heat exchanger for cooling a switch cabinet, each heat exchanger having a first line system for a first coolant and at least one second line system, separated fluidically from the first line system, for a second coolant, the first and the second line system being coupled thermally to one another, wherein the heat exchanger comprises a plurality of lamellae, adjacent lamellae forming between them an air flow duct through the heat exchanger, the air flow duct comprising an air flow direction through the heat exchanger, and the first and the second line system being disposed one behind the other in the air flow direction and being coupled thermally to one another via the plurality of lamellae, wherein:

the first heat exchanger is disposed in a first air passage with a first air inlet and with a first air outlet, which are open to an area surrounding the switch cabinet, and the second heat exchanger is disposed in a second air passage with a second air inlet and with a second air outlet, which are open to an interior of the switch cabinet, the first line system of the first heat exchanger forming with the first line system of the second heat exchanger a first closed coolant circuit, and the second line system of the first heat exchanger forming with the second line system of the second heat exchanger a second closed coolant circuit.

17. The cooling arrangement as claimed in claim 16, in which the lamellae are oriented parallel to one another.

18. The cooling arrangement as claimed in claim 16, wherein there is an air flow direction in the heat exchanger and in which the first and the second line system are disposed directly or indirectly aligned with each other in the air flow direction through the heat exchanger.

19. The cooling arrangement heat exchanger as claimed in claim 16, in which the first and the second line system have in each case a connection for a coolant forward flow and for a coolant return flow.

20. A heat exchanger for cooling a switch cabinet, with a first line system for a first coolant and with a second line system, separated fluidically from the first line system, for a second coolant, the first and the second line system being coupled thermally to one another, wherein the heat exchanger comprises a plurality of lamellae, adjacent lamellae forming between them an air flow duct through the heat exchanger, the air flow duct comprising an air flow direction through the heat exchanger, and one of the first and the second line systems being disposed behind the other of the first and second line systems in the air flow direction and being coupled thermally to one another via the plurality of lamellae, wherein the heat exchanger has a pair of longitudinal ends, and the lamellae are disposed centrally within the heat exchanger, spaced apart from the longitudinal ends of the heat exchanger.

* * * * *